United States Patent
Li et al.

(10) Patent No.: US 9,024,696 B2
(45) Date of Patent: May 5, 2015

(54) DIGITALLY CONTROLLED INJECTION LOCKED OSCILLATOR

(71) Applicant: Innophase, Inc., Chicago, IL (US)

(72) Inventors: Xi Li, Allen, TX (US); Yang Xu, Chicago, IL (US)

(73) Assignee: Innophase Inc., Chicago, IL (US)

( * ) Notice: Subject to any disclaimer, the term of this patent is extended or adjusted under 35 U.S.C. 154(b) by 0 days.

(21) Appl. No.: 13/840,379

(22) Filed: Mar. 15, 2013

(65) Prior Publication Data

US 2014/0266480 A1    Sep. 18, 2014

(51) Int. Cl.
H03B 5/12         (2006.01)

(52) U.S. Cl.
CPC ............ *H03B 5/1215* (2013.01); *H03B 5/1228* (2013.01); *H03B 5/1243* (2013.01); *H03B 2200/0074* (2013.01)

(58) Field of Classification Search
USPC .................................. 331/117 R, 167, 177 V
See application file for complete search history.

(56) References Cited

U.S. PATENT DOCUMENTS

| | | | |
|---|---|---|---|
| 6,369,659 B1 | 4/2002 | Delzer et al. | |
| 6,556,636 B1 | 4/2003 | Takagi | |
| 6,975,165 B2 | 12/2005 | Lopez Villegas et al. | |
| 7,095,274 B2 | 8/2006 | Lopez Villegas et al. | |
| 7,564,929 B2 | 7/2009 | Lopez Villegas et al. | |
| 7,710,210 B2 * | 5/2010 | Casper et al. ............. | 331/117 R |
| 7,961,058 B2 * | 6/2011 | Luong et al. ................... | 331/74 |
| 8,498,601 B2 | 7/2013 | Horng et al. | |
| 2004/0036538 A1 | 2/2004 | Devries et al. | |
| 2008/0150645 A1 | 6/2008 | McCorquodale et al. | |
| 2011/0050296 A1 | 3/2011 | Fagg | |
| 2012/0074990 A1 | 3/2012 | Sornin | |
| 2012/0256693 A1 | 10/2012 | Raghunathan et al. | |
| 2012/0306547 A1 | 12/2012 | Arora | |

FOREIGN PATENT DOCUMENTS

WO    2012132847    10/2012

OTHER PUBLICATIONS

Chi-Tsan Chen et al., Wireless Polar Receiver Using Two Injection-Locked Oscillator Stages for Green Radios, IEEE MTT-S International, Jun. 2011.
International Search Report and Written Opinion for PCT/US2014/030525 mailed Jul. 24, 2014.

(Continued)

*Primary Examiner* — Joseph Chang
(74) *Attorney, Agent, or Firm* — Invention Mine LLC (57) ABSTRACT

An injection locking oscillator (ILO) comprising a tank circuit having a digitally controlled capacitor bank, a cross-coupled differential transistor pair coupled to the tank circuit, at least one signal injection node, and at least one output node configured to provide an injection locked output signal; a digitally controlled injection-ratio circuit having an injection output coupled to the at least one signal injection node, configured to accept an input signal and to generate an adjustable injection signal applied to the at least one injection node; and, an ILO controller connected to the capacitor bank and the injection-ratio circuit configured to apply a control signal to the capacitor bank to adjust a resonant frequency of the tank circuit and to apply a control signal to the injection-ratio circuit to adjust a signal injection ratio.

24 Claims, 7 Drawing Sheets

(56) References Cited

OTHER PUBLICATIONS

Jose Maria Lopez-Villegas et al., BPSK to ASK Signal Conversion Using Injection-Locked Oscillators-Part I: Theory, Dec. 2005, IEEE Transactions on Microwave Theory and Techniques, vol. 53, No. 12, available online at: http://diposit.ub.edu/dspace/bitstreann/2445/8751/1/529612.pdf.

International Search Report for PCT/US2013/024159 mailed Apr. 9, 2013.

Chi-Tsan Chen, Cognitive Polar Receiver Using Two Injection-Locked Oscillator Stages, IEEE Transactions on Microwave Theory and Techniques, vol. 59, No. 12, Dec. 2011.

N. Siripon, et al., Novel Sub-Harmonic Injection-Locked Balanced Oscillator, Microwave and Systems Research Group (MSRG), School of Electronics, Computing and Mathematics, University of Surrey, Sep. 24, 2011, 31st European Microwave Conference.

Hamid R. Rategh, et al., Superharmonic Injection Locked Oscillators as Low Power Frequency Dividers, Stanford University, Stanford, California.

Behzad Razavi, A Study of Injection Pulling and Locking in Oscillators, Electrical Engineering Department, University of California, 2003, IEEE, Custom Integrated Circuits Conference.

Marc Tiebout, A 50GHz Direct Injection Locked Oscillator Topology as Low Power Frequency Divider in 0.13 µm CMOS, Infineon Technologies AG, Solid-State Circuits Conference, 2003, pp. 73-76, 29th European ESSCIRC.

Pei-Kang Tsai, et al., Wideband Injection-Locked Divide-by-3 Frequency Divider Design with Regenerative Second-Harmonic Feedback Technique, RF@CAD Laboratory, Department of Electrical Engineering, National Cheng Kung University, Tainan, Taiwan.

Aeroflex, Application Note, Measurement of Frequency Stability and Phase Noise, Feb. 2007, part No. 46891/865.

Hewlett Packard, Phase Noise Characterization of Microwave Oscillators, Frequency Discriminator Method, Sep. 1985, USA.

Paul O'Brien, A Comparison of Two Delay Line Discriminator Implementations Ireland.

Claude Frantz, Frequency Discriminator, published 1994.

Electronic Warfare and Radar Systems Engineering Handbook, Mixers and Frequency Discriminators, Section 6-8.1 to 6-8.2, Apr. 1, 1999, Naval Air Systems Command and Naval Air Warfare Center, USA.

International Search Report and Written Opinion for PCT/US2014/029055 mailed Sep. 15, 2014.

\* cited by examiner

DIGITALLY CONTROLLED INJECTION LOCKED OSCILLATOR

CROSS REFERENCE TO RELATED APPLICATIONS

This application is related to the following co-pending applications, filed on even date herewith, all of which are incorporated herein by reference in their entirety: U.S. application Ser. No. 13/840,478, filed Mar. 15, 2013, entitled POLAR RECEIVER SIGNAL PROCESSING AND ARCHITECTURE; U.S. application Ser. No. 13/839,557, filed Mar. 15, 2013, entitled POLAR RECEIVER SIGNAL PROCESSING APPARATUS AND METHODS; U.S. application Ser. No. 13/839,462, filed Mar. 15, 2013, entitled LNA WITH LINEARIZED GAIN OVER EXTENDED DYNAMIC RANGE; and, U.S. application Ser. No. 13/842,470, filed Mar. 15, 2013, entitled SINGLE-BIT DIRECT MODULATION TRANSMITTER.

BACKGROUND OF THE INVENTION

Injection-locked oscillators (ILO) are oscillators that exhibit the characteristic that the oscillation frequency can be locked to a frequency of an external injection signal rather than to its inherent resonance frequency, or free-running frequency. ILOs are usually based on cross-coupled transistors and tank circuits, and have been employed for frequency division.

Recently, polar receiver architectures using ILOs have been proposed that extract the modulation envelope and phase components from a received non-constant envelope modulation signal without using a carrier recovery circuitry. However, the proposed polar receiver architectures and associated signal processing have limitations or deficiencies that result in poor performance and high bit error rates (BER). Accordingly, there is a need for improved ILO configurations in polar receiver signal processing and architectures, as well as for other uses.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Figure 1:
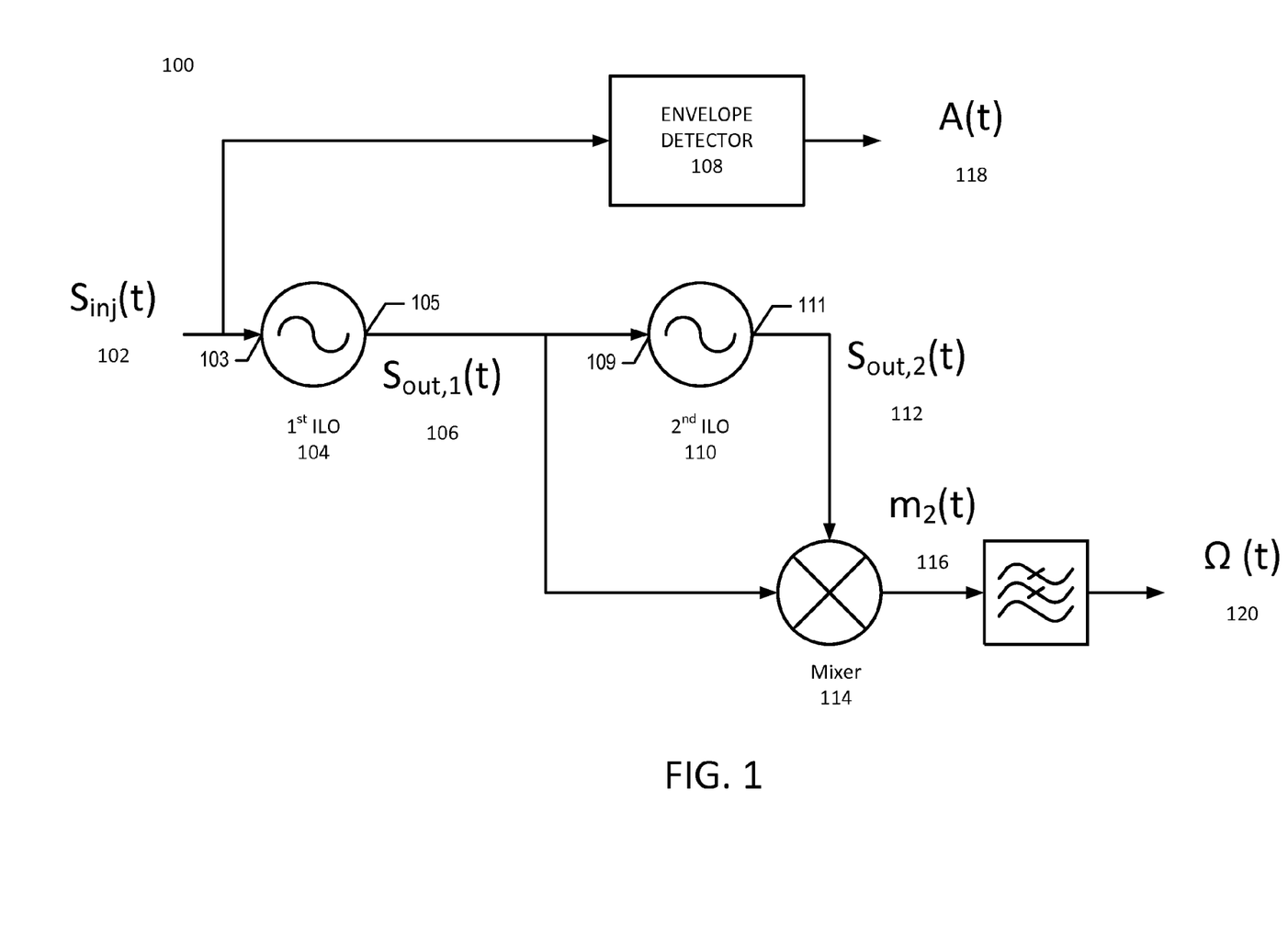
FIG. 1 is a block diagram of a polar receiver in accordance with some embodiments.

With reference to FIG. 1, a block diagram of a polar receiver 100 will be described in accordance with some embodiments. The injection signal $S_{inj}(t)$ 102, which is a received modulated signal having a variable phase component, is applied to an input node 103 of the second harmonic injection locked oscillator (ILO) 104 (also referred to herein as a harmonic ILO). The harmonic ILO of the polar receiver may be configured to receive a modulated signal having phase variations in a first range $\pm\phi$ radians, and provide an output signal having a second range of phase variations equal to $\pm\phi/2$ radians. In at least one embodiment, $\phi=\pi$. The apparatus may be configured to receive a modulated signal in the form of either a phase shift keying signal, a quadrature amplitude modulated signal, a single carrier signal, or an orthogonal frequency division multiplexed signal. The output signal of the harmonic ILO $S_{out,1}(t)$ 106 at node 105 has a compressed variable phase component, as will be described below. The compressed variable phase signal 106 is applied to input node 109 of the fundamental injection locked oscillator ILO 110 (also referred to herein as a fundamental ILO), and undergoes a delay to generate the output signal $S_{out,2}(t)$ 112 at output node 111. That is, $S_{out,1}(t)$ 106 and $S_{out,2}(t)$ 112 are related by a time delay imposed by fundamental ILO 110. $S_{out,1}(t)$ 106, which is the phase compressed signal, and $S_{out,2}(t)$ which is the delayed phase compressed signal, are applied to mixer 114 to generate an output signal $m_2(t)$ 116. The mixer output signal 116 is low pass filtered to remove the double frequency components present at the output of the mixer 114, to obtain an estimated phase derivative signal $\Omega(t)$ 120. The injection signal $S_{inj}(t)$ 102 is also applied to the envelope detector 108 to generate an amplitude waveform $A(t)$ 118.

Figure 2:
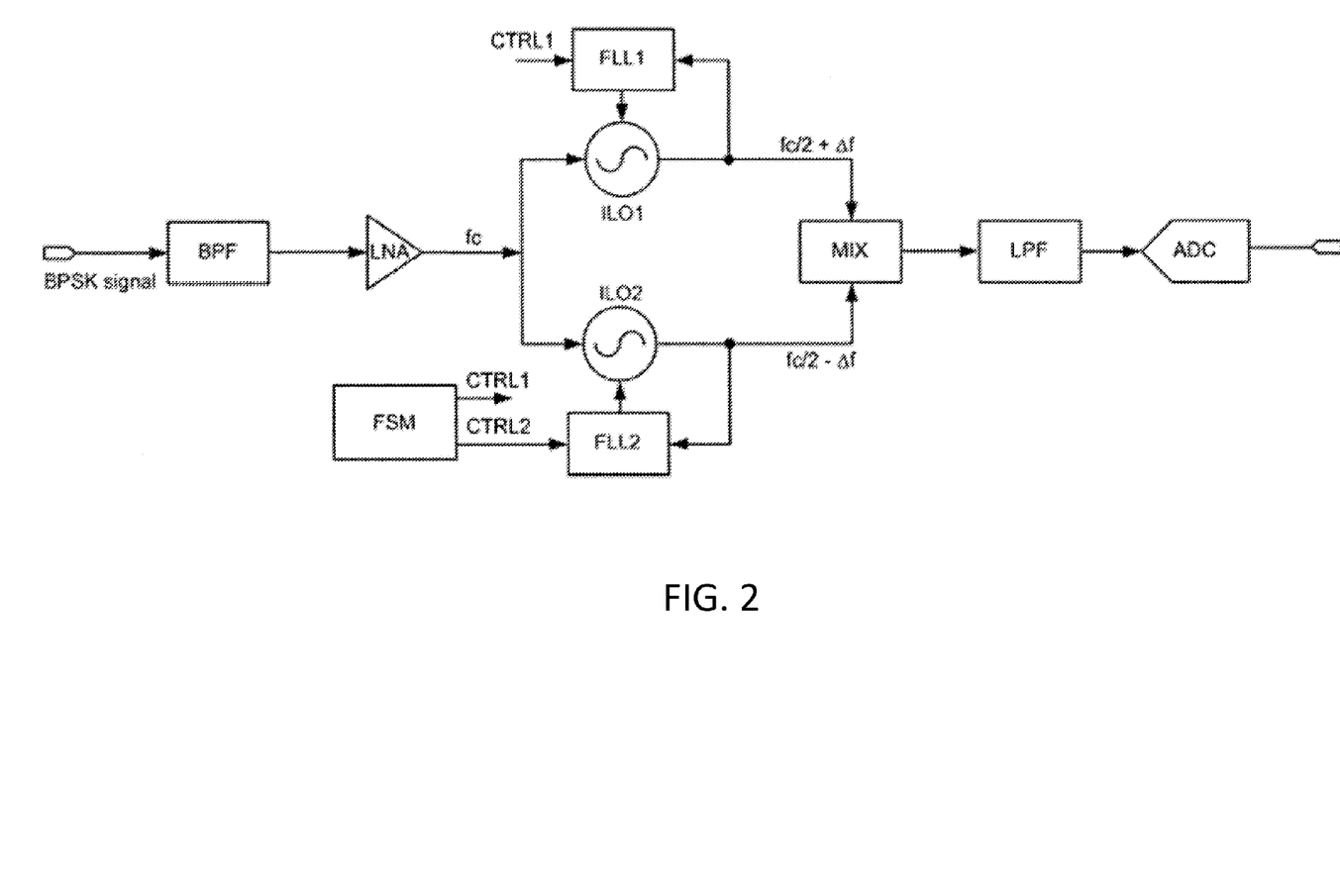
FIG. 2 is a block diagram of an alternative polar receiver in accordance with some embodiments.

With reference to FIG. 2, an alternative embodiment of an ILO-based receiver structure will be described. The receiver architecture receives an incoming BPSK signal that may be initially filtered by a Band-Pass Filter (BPF) that selects the signal band centered at carrier frequency (fc) to be processed. The signal is amplified by a Low Noise Amplifier (LNA) while introducing little noise to the signal path. A suitable LNA having a combined bandpass filter characteristic is described in co-pending application Ser. No. 13/839,462 filed Mar. 15, 2013, entitled LNA WITH LINEARIZED GAIN OVER EXTENDED DYNAMIC RANGE.

The BPSK signal at a carrier frequency of $f_c$ is fed to two Injection Locked Oscillators (ILO) controlled by two Frequency-locked loops (FLL). The two injection-locked oscillators (ILOs) are configured to provide for BPSK to amplitude shift keying (ASK) conversion.

The two FLLs may be engaged to set an initial frequency of the two ILOs at $f_c/2+\Delta f$, and $f_c/2-\Delta f$ before releasing the control to the incoming BPSK signal. That is, the free-running frequencies of the ILOs may be adjusted in the absence of an injection signal. The FLL may measure the frequency and accordingly adjust the free-running frequency using the structures and methods described herein. In an embodiment, the sequence of various controlling stages is set by a Finite State Machine (FSM).

Upon injection to the ILOs, the BPSK signal will re-lock the two ILOs to $f_c/2$, while their output will be mixed (e.g. adding, subtracting, multiplying) by a MIX block to produce a signal reflecting the phase change at the input BPSK signal. The output signal of MIX block is then AC coupled to a Low-Pass Filter (LPF), before being sampled by an Analog-to-Digital Converter (ADC) to produce the demodulated bit sequence.

Further details of the embodiment of FIG. 2 may be found in co-pending U.S. Provisional Patent Application Ser. No. 61/615,169, filed Mar. 23, 2012, entitled Receiver and Transmitter Architecture and Methods for Binary and Quadrature Phase Shift Keying Signals, the contents of which are incorporated herein by reference.

Figure 3:
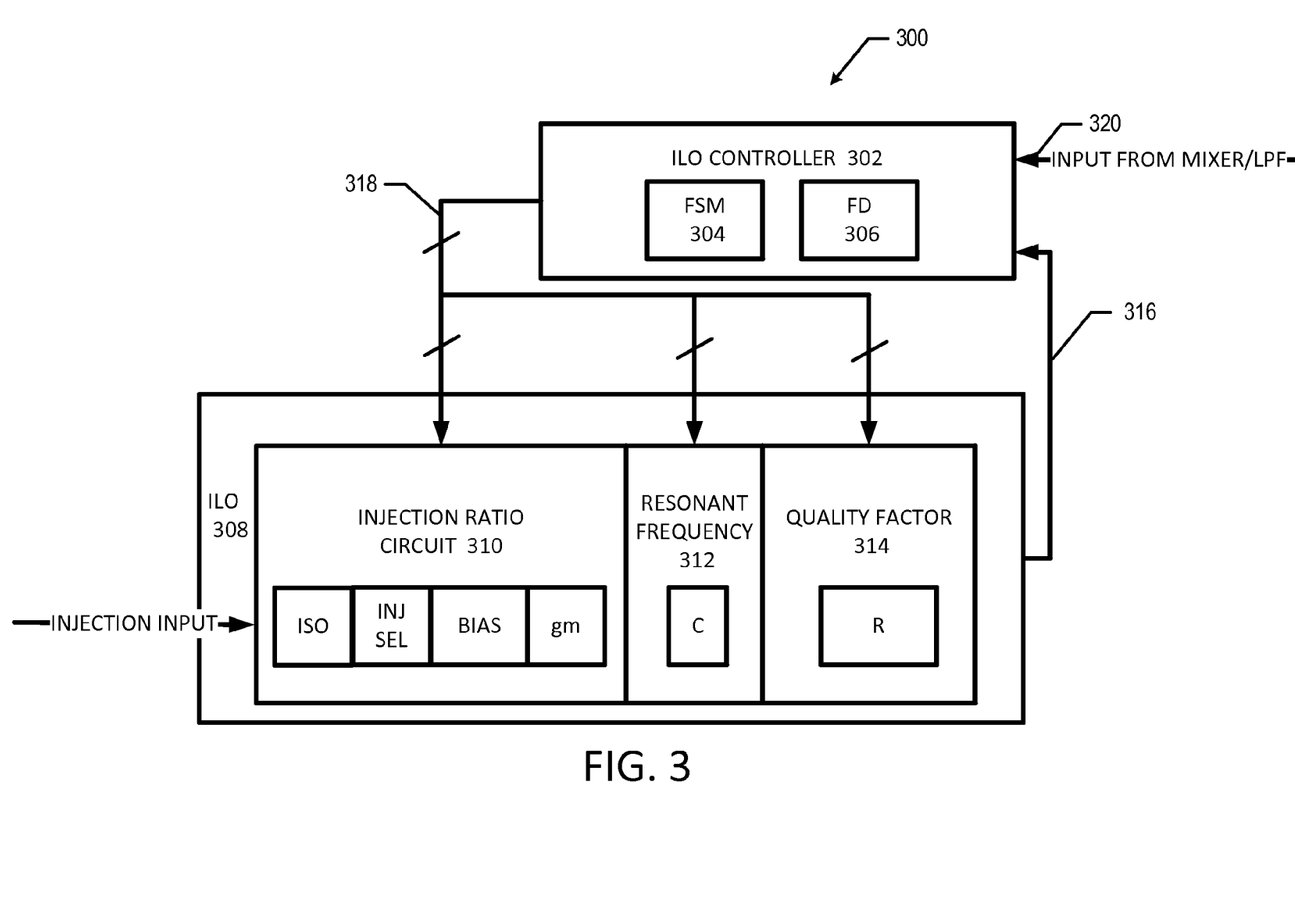
FIG. 3 is a block diagram of a configurable ILO circuit and ILO control circuit in accordance with some embodiments.

With reference to FIG. 3, a controllable ILO circuit 300 including an ILO controller 302 and ILO circuit 308 will be described according to some embodiments. The ILO controller 302 may include a finite state machine 304, and a frequency detector 306. The frequency detector may comprise configurable counters so as to alter the characteristics of the control loop to attain different frequencies.

The ILO controller 302 may be configured to provide a control output signal on the control output line 318 to the ILO 308. The control output may include multiple parallel bits for controlling each of an injection ratio circuit 310, a resonant frequency circuit 312, and a quality factor adjustment circuit 314. The injection ratio circuit 310 may include an adjustable bias (BIAS) and/or and adjustable transconductance amplifier stage (gm) to control the injection ratio, an injection selection circuit (INJ SEL) to configure the ILO as a fundamental or harmonic ILO, as well as an isolation circuit (ISO) to remove or otherwise isolate the injection signal from the input of the ILO 308. The resonant frequency circuit 312 may include variable capacitors (C) such as a capacitor bank. The quality factor circuit 314 may include a variable resistor (R) such as a resistor bank. The output of the ILO 308 is applied to the ILO controller 302 over signaling line 316. In some embodiments the ILO controller 302 may use the frequency detector to determine a free running frequency of the ILO 308. The ILO controller may responsively adjust the free running frequency, such as by altering a capacitance in a tank circuit of the ILO 308.

In some embodiments the ILO controller 302 may receive an input from the output of a mixer, or a low pass filtered version of the mixer output over the input line 320. In one embodiment the signal on line 320 is monitored for a DC offset component, which is used as a performance metric for adjusting parameters of the ILO 308. In one embodiment, the presence of a DC component may indicate the need to adjust parameters of the ILO 308 in order to obtain a desired phase difference between an input of the ILO 308 and the output of the ILO 308. In this embodiment, the mixer inputs are connected to the input and output of ILO 308.

Figure 4:
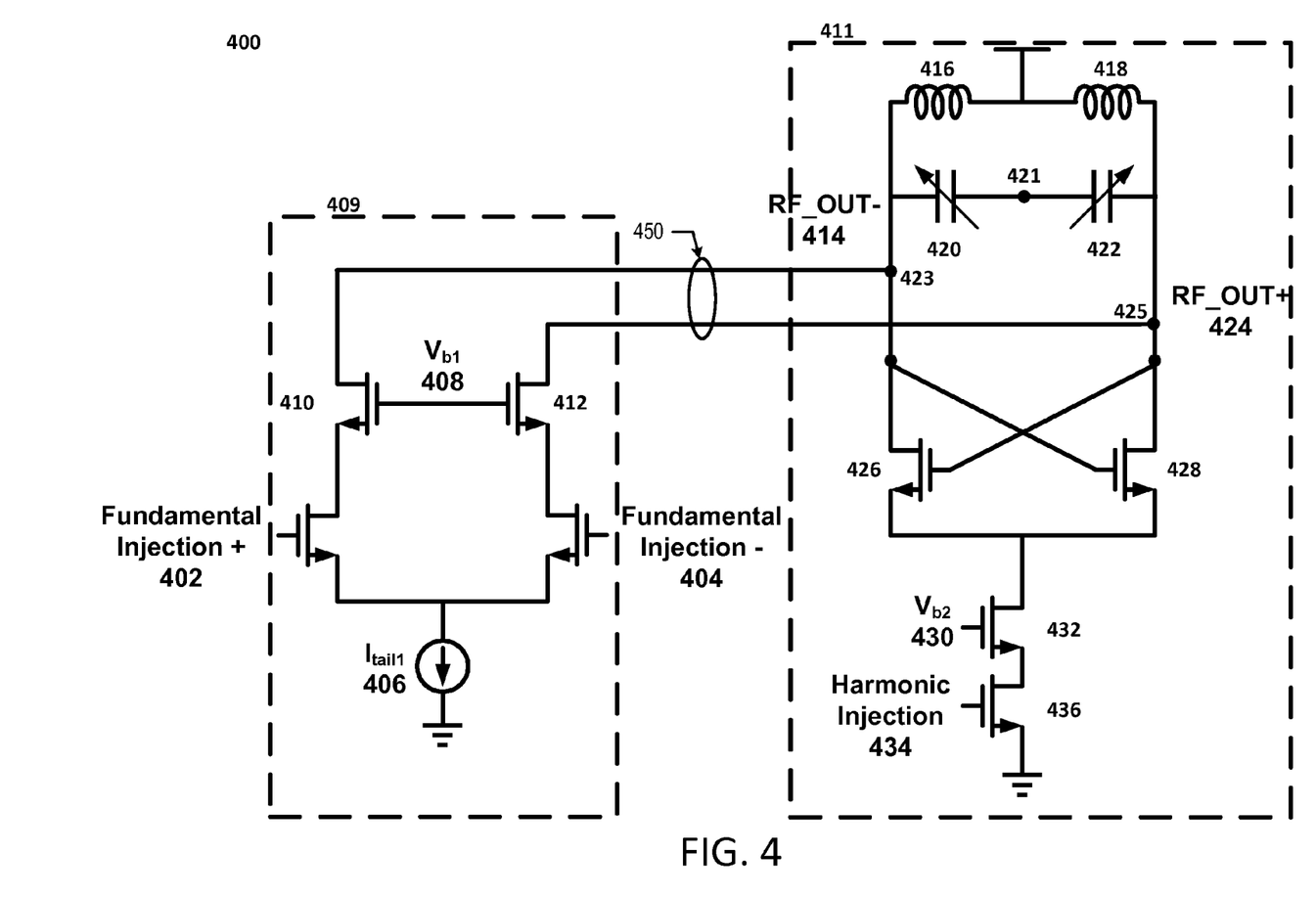
FIG. 4 is a circuit diagram of one embodiment of an injection locking oscillator in accordance with some embodiments.

With reference to FIG. 4, an example of an injection locking oscillator 400 will be described. In one embodiment, the ILO 400 may be configured with a harmonic injection node at the common mode node 434 using FET 436. In an alternative embodiment the common mode node 421 may also be used for harmonic injection. In yet a further alternative embodiment both nodes 421 and 434 may be used to inject a harmonic locking signal. The tank circuit together with the cross-coupled transistor pair 426, 428, will oscillate and lock to a frequency associated with a harmonic of the injection signal. In one embodiment the harmonic is a second harmonic, such that the output frequency at nodes 423, 425 will be one half the frequency of the injected signal. In this embodiment the free running frequency of the ILO will be tuned to be near the harmonic frequency $f_c/2$, where $f_c$ is the carrier or center frequency of the received signal. In the harmonic ILO embodiment the transconductance gain stage 409 is not necessary—is either switched off by a control circuit, or is not present. In embodiments where the ILO is a dedicated harmonic ILO, then the injection selection circuit (INJ SEL) in the form of additional switches to control the routing of the injection signal is also disabled or not present.

Alternatively the ILO 400 may be configured with a fundamental injection signal applied at nodes 402, 404, in a differential manner. Together with the transistor pair 410, 412, stage 409 provides a transconductance of the voltage input signal to a current signal to be injected at nodes 423, 425. The tank circuit together with the cross-coupled transistor pair 426, 428, will oscillate and lock to a frequency associated with the fundamental injection signal. Similarly, in embodiments where the ILO is a dedicated fundamental ILO, then the injection selection circuit (INJ SEL) in the form of additional switches to control the routing of the injection signal is also disabled or not present.

Figure 5:
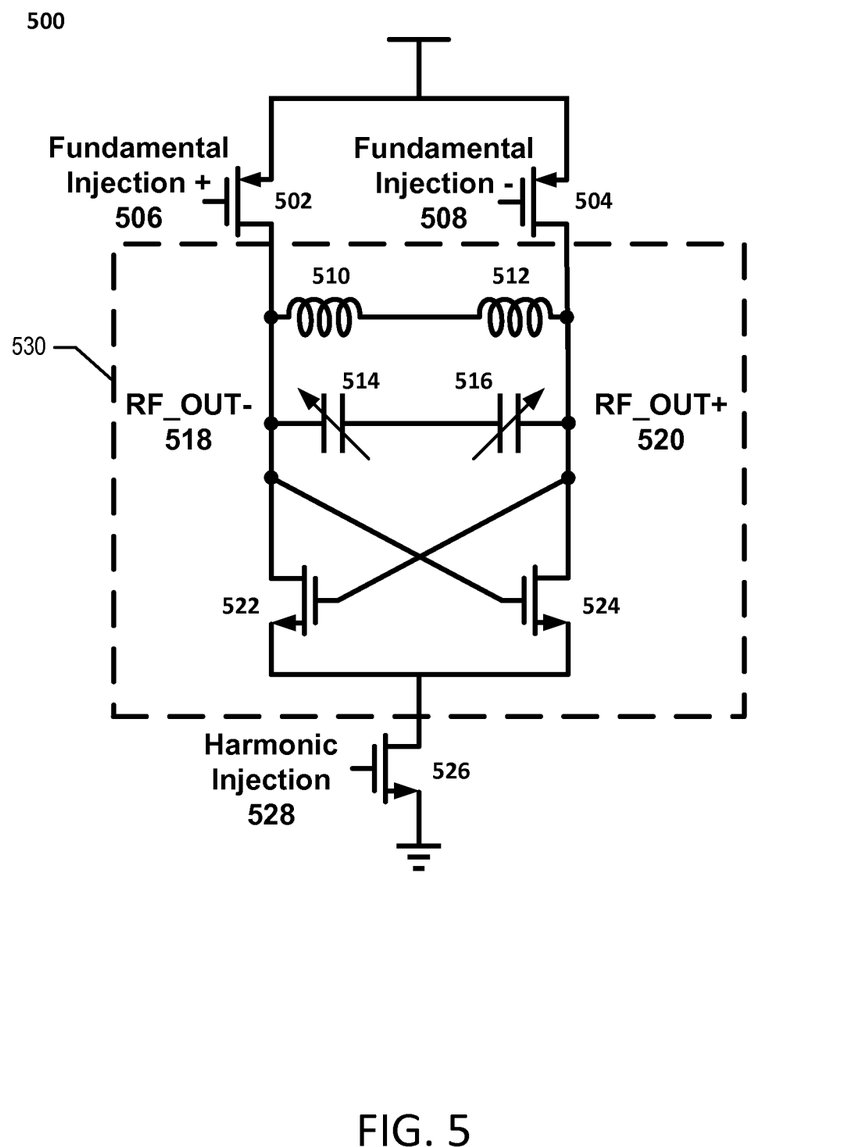
FIG. 5 is a circuit diagram of another embodiment of an injection locking oscillator in accordance with some embodiments.

Respect to FIG. 5, an alternative embodiment of an ILO 500 will be described. As is the case with ILO 400, ILO 500 may be configured as (i) a dedicated fundamental ILO having a signal injected at the differential node 506, 508, via transistors 502, 504, (ii) a dedicated harmonic ILO having a harmonic injection node 528 using transistor 526, or (iii) an ILO that may be dynamically configured to be either fundamental or harmonic by way of an injection selection circuit (INJ SEL) that controls the application of the injection signal accordingly.

In the various embodiments, including both fundamental and harmonic ILOs, the resonance circuit 411, 530 may include a tank circuit having variable capacitors (420, 422), (514, 516) and inductors (416, 418), (510, 512). In an alternative embodiment the tank circuit may take the form of an RC tank circuit, and include variable capacitors and resistors. The resonant frequency control circuit 312 may comprise the variable capacitors.

Figure 6:
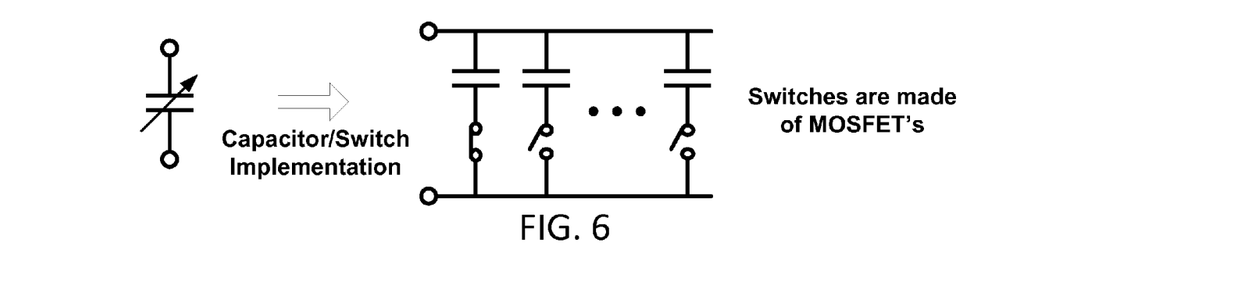
FIGS. 6 and 7 are implementations of capacitor banks in accordance with some embodiments.
Figure 7:
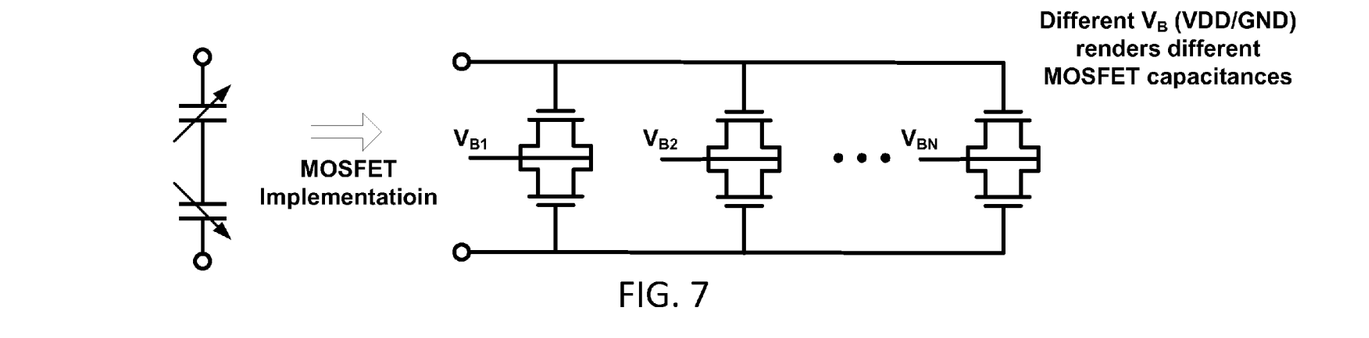

An example of a capacitor bank is shown in FIGS. 6 and 7. Each capacitor may be controlled individually by using a separate bit to control its corresponding switch. The capacitors in the capacitor bank may take the same value or different values such that each bit controls a capacitance cell having a proportionally larger amount of capacitance. Capacitance variations may be accomplished by using varying configurations of serially connected and/or parallel connected capacitors, by using different device sizes, or by using different bias voltages, as just a few examples of embodiments of a capacitance bank. The ILO controller 302 may monitor the output of the ILO over signaling line 316 using the frequency detector and adjust a free running frequency by altering the capacitance value (while the injection signal is isolated from the ILO using the ISO circuit).

The injection ratio circuit 310 may take various forms depending on whether the ILO is a fundamental or harmonic ILO configuration. Generally, the injection ratio is given by:

$$\alpha = \frac{I_{inj}}{I_{bias}},$$

indicating that the injection coefficient may be altered by changing the injection current, or by changing the bias current in the oscillator.

Figure 9:
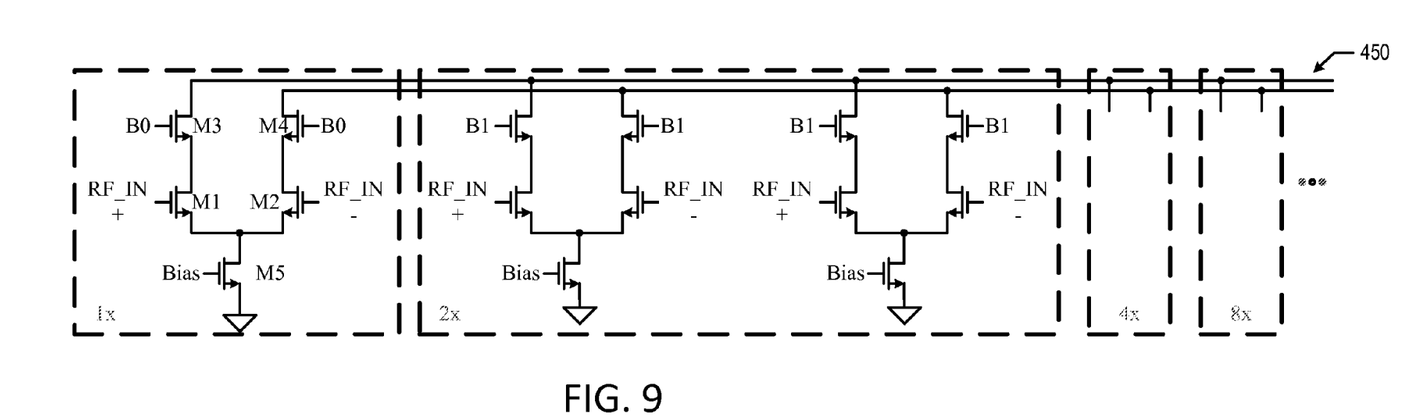
FIG. 9 is an implementation of cells used to provide digitally controlled variable gain in accordance with some embodiments.

With reference to ILO 400, having a variable gain transconductance stage 409, the variable gain at output nodes 450 may be achieved by switching in additional transistor devices at the fundamental injection nodes 402, 404. One such variable transconductance stage is shown in FIG. 9. The control signal from the ILO controller 302 may include numerous bits B0, B1, B2 etc. Control bit B0 may be used to control a first cell, control bit B1 may be used to control a second cell, and control bit B2 may be used to control a third cell. Note that the first second and third cells each provide an increasing amount of transconductance amplification. The code may be referred to as a binary code in that each bit controls an amplification of twice the prior stage. In an alternative embodiment, each cell may add the same amount of gain, in which case the binary control word may be referred to as a thermometer code.

In the embodiment of ILO 500, the devices at the fundamental injection nodes 506, 508, may include additional parallel cells of one or more transistors connected in parallel with each of the transistors 502, 504, such that a binary code and/or thermometer code may be used to adjust the injection fraction of ILO 500.

Figure 8:
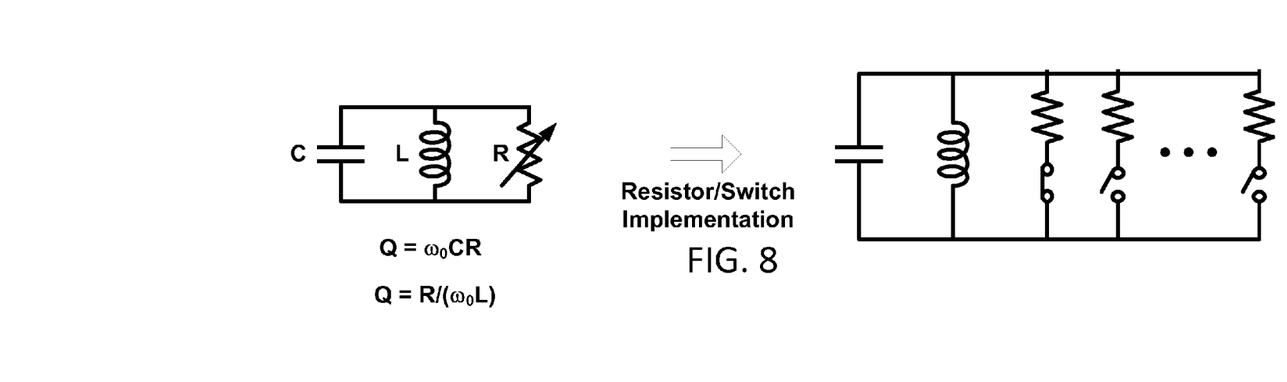
FIG. 8 is an implementation of a resistor bank in accordance with some embodiments.

For ILO embodiments 400, 500, the injection fraction for the harmonic injection may be adjusted by changing a bias current, and or altering the size of the harmonic injection transistor device. In addition, the quality factor Q, may be adjusted by selectively inserting resistance using a resistor bank (R), which may be realized as depicted in FIG. 8.

In accordance with an embodiment, an apparatus may comprise an injection locking oscillator (ILO) comprising a tank circuit having a digitally controlled capacitor bank, a cross-coupled differential transistor pair coupled to the tank circuit, at least one signal injection node, and at least one output node configured to provide an injection locked output signal. The apparatus may include a digitally controlled injection-ratio circuit having an injection output coupled to the at least one signal injection node, configured to accept an input signal and to generate an adjustable injection signal applied to the at least one injection node, and may further include an ILO controller connected to the capacitor bank and the injection-ratio circuit. The ILO controller may be configured to apply a control signal to the capacitor bank to adjust a resonant frequency of the tank circuit and to apply a control signal to the injection-ratio circuit to adjust a signal injection ratio.

In an embodiment the at least one injection node of the apparatus may include a pair of differential mode injection nodes. Alternatively, the at least one injection node is a common mode injection node. The injection-ratio circuit may include a plurality of parallel stages connected to the controller for providing the adjustable injection signal. In an embodiment, the parallel stages comprise a variable transconductance amplifier stage. The variable transconductance stage may include at least some transconductance stages providing different amounts of gain. In an embodiment, the parallel stages comprise a plurality of parallel injection transistors. In other embodiments, the injection-ratio circuit includes a bias current adjustment circuit. The bias adjustment may be made by parallel devices to alter current, or by a bias voltage adjustment.

In other embodiments, the at least one injection node comprises a common mode injection node and a pair of differential mode injection nodes, the apparatus further comprising a digitally controlled injection node selection circuit configured to selectably apply the adjustable injection signal to either the common mode injection node or to the pair of differential mode injection nodes.

In a further embodiment, the apparatus may further comprise a mixer having inputs configured to accept the input signal and the injection locked output signal, and be configured to provide an output signal at a mixer output node, and a control circuit for adjusting a ILO delay characteristic between the input signal and the injection locked output signal based on the output signal at the mixer output node.

In yet other embodiments, the apparatus may comprise an injection locking oscillator (ILO) comprising a tank circuit having a digitally controlled capacitor bank, a cross-coupled differential transistor pair coupled to the tank circuit, at least one common mode signal injection node and at least one differential mode signal injection node, and at least one output node configured to provide an injection locked output signal; an injection node selection circuit configured to apply an injection signal having a center frequency $f_c$ to either the at least one common mode injection node or at least one differential mode injection node; and, an ILO controller circuit connected to the digitally controlled capacitor bank and to the injection node selection circuit, and configured to either (i) cause the injection node selection circuit to apply the injection signal to a common mode injection node and to apply a control signal to the capacitor bank to adjust a resonant frequency of the tank circuit to be approximately $f_c$ or (ii) cause the injection node selection circuit to apply the injection signal to differential mode injection node and to apply a control signal to the capacitor bank to adjust a resonant frequency of the tank circuit to be approximately $f_c/2$.

The apparatus may further comprise an injection-ratio circuit configured to adjust a signal injection ratio, and wherein the ILO controller circuit is connected to the injection-ratio circuit and is configured to adjust a signal injection ratio.

Figure 10:
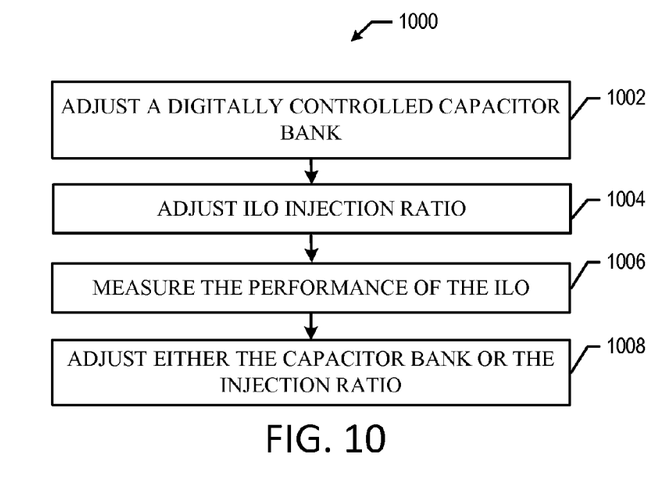
FIG. 10 is a flow chart depicting a method of ILO adjustment in accordance with some embodiments.

With respect to FIG. 10, a method 1000 according to some embodiments will be described. The method 1000 may comprise adjusting 1002 a digitally controlled capacitor bank of a tank circuit in an injection locking oscillator (ILO). This adjustment may be to tune the free running frequency of the ILO to be near a desired signal such as a carrier frequency $f_c$, or a second harmonic $f_c/2$. In a further embodiment, the free running frequency may be changed to alter a time delay or phase difference between an input injection signal and the ILO output signal. The method may also include adjusting 1004 an ILO injection ratio using a digitally controlled injection-ratio circuit. The adjustment may be made to ensure the ILO is operating in a strong injection region, such as an injection fraction α>0.1. In a further embodiment, the injection fraction may be changed to alter a time delay or phase difference between an input injection signal and the ILO output signal. The method may also include measuring 1006 the performance of the ILO and responsively adjusting 1008 either the capacitor bank or the injection ratio. In some embodiments, measuring the performance of the ILO comprises: generating a mixer output by mixing an input of the ILO and an output of the ILO and measuring a DC offset component of the mixer output.

In still further embodiments, the method may further comprising adjusting a digitally controlled resistor bank of the tank circuit to alter a quality factor Q of the ILO.

Again with respect to FIG. 1, the fundamental ILO has an input node connected to the compressed output node of the harmonic ILO. The fundamental ILO also has a delayed-output node, and is configured to generate, at the delayed output node, a phase-compressed signal having a delayed compressed variable phase component that is delayed relative to the compressed variable phase component. A mixer may then use the input and output of the fundamental ILO to generate an estimate of the derivative of the phase changes of the phase-compressed signal.

One aspect of injection locking oscillators is referred to as a metastable state. The metastable state may result in the phenomena that when a phase change of the input signal occurs, the ILO may regain its locked condition by adjusting the phase of its output in a direction opposite to the input phase change until the steady state condition is achieved. Thus, in some cases, a phase change in an input signal caused by a momentary increase in the input signal frequency may actually result in a momentary decrease in the output frequency in order to delay the phase of the output signal until the ILO is again locked. Such a phenomenon imparts an erroneous change in the frequency/phase characteristic of the ILO output signal that may cause errors when using an input and output of a fundamental ILO to generate an estimate of the derivative of the phase variations. In one embodiment, the output of a mixer may be altered to detect erroneous phase changes and to responsively adjust the ILO parameters described above until the erroneous phase changes are eliminated or decreased to an acceptable level.

Note that the errors may occur when the phase change of the input is large enough so that the input-output ILO phase difference is greater than a phase difference associated with the metastable state. Because the metastable state is more likely to impart erroneous frequency or phase changes in the ILO output when the input phase change is larger, the phase compression obtained from the use of a second harmonic ILO as an initial stage in the polar receiver significantly reduces errors and improves performance of the receiver.

In a further embodiment, the second harmonic ILO and the fundamental ILO may be adjustable to obtain the desired characteristics or performance of the polar receiver. In an embodiment, the second harmonic ILO may be adjusted to select a desired signal having a predetermined carrier frequency. The adjustment to the ILO may be to change the free-running frequency $f_r$ of the second harmonic ILO, such as by altering a capacitance of the ILO tank circuit. The polar receiver may include an ILO control circuit configured to measure a free running frequency $f_r$ of the ILO after removing the injection input signal, such as by controlling a switch. The ILO control circuit may adjust a capacitance of the tank circuit until the free running frequency $f_r$ has a desired relationship to the carrier signal $f_c$ (or channel center frequency). The desired relationship may be that $f_r$ is offset from $f_c/2$. The ILO control circuit may also adjust one or more parameters of the second harmonic ILO including an ILO injection coefficient $\alpha$, a quality factor Q, and a capacitance of a tank circuit to adjust the free running frequency $f_r$.

The ILO control circuit may also be configured to adjust one or more parameters of the fundamental ILO to adjust an amount of delay associated with the delayed phase-compressed signal. The delay may be adjusted by adjusting one or more parameters including an injection coefficient $\alpha$, a quality factor Q, and a free running frequency $f_r$. The injection coefficient may be adjusted by altering a transconductance stage at the ILO input, or by adding or removing parallel-configured signal injection node devices, or by altering bias signals within the ILO. The quality factor may be adjusted by altering a resistance value within the tank circuit. The free running frequency may be adjusted by altering a capacitance of the ILO tank circuit such as by a capacitor bank or varactor. The characteristics of both the second harmonic ILO and fundamental ILO, including Q, $f_r$, and $\alpha$ may be adjusted according to the structures and methods described herein.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Accordingly, some embodiments of the present disclosure, or portions thereof, may combine one or more processing devices with one or more software components (e.g., program code, firmware, resident software, micro-code, etc.) stored in a tangible computer-readable memory device, which in combination form a specifically configured apparatus that performs the functions as described herein. These combinations that form specially programmed devices may be generally referred to herein "modules". The software component portions of the modules may be written in any computer language and may be a portion of a monolithic code base, or may be developed in more discrete code portions such as is typical in object-oriented computer languages. In addition, the modules may be distributed across a plurality of computer platforms, servers, terminals, and the like. A given module may even be implemented such that separate processor devices and/or computing hardware platforms perform the described functions.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An apparatus comprising:
   an injection locking oscillator (ILO) comprising a tank circuit having a digitally controlled capacitor bank, a cross-coupled differential transistor pair coupled to the tank circuit, at least one signal injection node, and at least one output node configured to provide an injection locked output signal having a compressed variable phase component;
   the at least one signal injection node, configured to accept an input signal that is a modulated signal having a variable phase component of a carrier signal having frequency $f_c$; and,
   an ILO controller connected to the capacitor bank configured to apply a control signal to the capacitor bank to adjust a resonant frequency of the tank circuit to be offset from a harmonic frequency $f_c/2$.

2. The apparatus of claim 1 wherein the at least one injection node is a common mode injection node.

3. The apparatus of claim 1 wherein the ILO controller comprises a frequency detector configured to determine a resonant frequency, wherein the controller adjusts the capacitors to adjust a free-running frequency of the ILO.

4. The apparatus of claim 3 wherein the frequency detector comprises configurable counters.

5. The apparatus of claim 1 wherein a quality factor of the ILO is adjusted by altering a resistive component of the tank circuit.

6. The apparatus of claim 1 wherein the modulated signal is a phase shift keying signal.

7. The apparatus of claim 1 wherein the modulated signal is a quadrature amplitude modulated signal.

8. The apparatus of claim 1 wherein the modulated signal is a single carrier signal.

9. The apparatus of claim 1 wherein the modulated signal is an orthogonal frequency division multiplexed signal.

10. The apparatus of claim 1 wherein the variable phase component includes phase variations in a first phase range and the compressed variable phase component includes phase variations in a second phase range.

11. The apparatus of claim 10 wherein the first range of phase variations is ±cp radians, and the second range of phase variations is ±φ/2 radians.

12. The apparatus of claim 11 wherein φ=π radians.

13. The apparatus of claim 1 wherein the digitally controlled capacitor bank comprises two variable capacitive elements and the at least one signal injection node is a common mode node located between the two variable capacitive elements.

14. The apparatus of claim 1 wherein respective sources of the cross-coupled differential transistor pair are coupled to a shared node and the at least one signal injection node is a gate of a first transistor, wherein the drain of the first transistor is connected to the shared node via a second transistor and a source of the first transistor is shunted to ground.

15. A method comprising:
   determining a carrier frequency $f_c$ of a received modulated signal having a variable phase component;
   adjusting a digitally controlled capacitor bank of a tank circuit in an injection locking oscillator (ILO) so that a free running frequency of the ILO is offset with respect to a harmonic frequency $f_c/2$;
   injecting the received modulated signal into the ILO; and,
   generating an injection locked output signal having a compressed variable phase component.

16. The method of claim 15 further comprising measuring the performance of the ILO and responsively adjusting a digitally controlled resistor bank of the tank circuit.

17. The method of claim 16 wherein measuring the performance of the ILO comprises measuring the free-running frequency of the ILO.

18. The method of claim 16 wherein measuring the performance of the ILO comprises:
   generating a mixer output by mixing an input of the ILO and an output of the ILO; and,
   measuring a DC offset component of the mixer output.

19. The method of claim 15 further comprising measuring the performance of the ILO and responsively adjusting the capacitor bank.

20. The method of claim 15 wherein measuring the performance of the ILO comprises measuring a quality factor of the ILO.

21. The method of claim 15 wherein the generated injection locked output signal having the compressed variable phase component is provided as input to a phase discriminator.

22. An apparatus comprising:
   an injection locking oscillator (ILO) comprising a tank circuit having a digitally controlled capacitor bank, a cross-coupled differential transistor pair coupled to the tank circuit, at least one common mode signal injection node and at least one differential mode signal injection node, and at least one output node configured to provide an injection locked output signal having either (i) a compressed variable phase component when an injection signal is applied to the at least one common mode injection node or (ii) a delayed variable phase component when an injection signal is applied to the at least one differential mode injection node;
   an injection node selection circuit configured to either (iii) apply an injection signal having a center frequency $f_c$ to the at least one common mode injection node or (iv) apply an injection signal having a center frequency $f_c/2$ to the at least one differential mode injection node, wherein the injection signal is a modulated signal having a variable phase component; and,
   an ILO controller circuit connected to the digitally controlled capacitor bank and to the injection node selection circuit, and configured to either (v) cause the injection node selection circuit to apply the injection signal to a common mode injection node and to apply a control signal to the capacitor bank to adjust a resonant frequency of the tank circuit to be offset from $f_c/2$ or (vi) cause the injection node selection circuit to apply the injection signal to differential mode injection node and to apply a control signal to the capacitor bank to adjust a resonant frequency of the tank circuit to be offset from $f_c/2$.

23. The apparatus of claim 22 wherein an ILO controller circuit is a finite state machine.

24. The apparatus of claim 22 further comprising an injection-ratio circuit configured to adjust a signal injection ratio, and wherein the ILO controller circuit is connected to the injection-ratio circuit and is configured to adjust a signal injection ratio.

* * * * *